US007356797B2

(12) United States Patent
Bhat et al.

(10) Patent No.: US 7,356,797 B2
(45) Date of Patent: Apr. 8, 2008

(54) LOGIC TRANSFORMATION AND GATE PLACEMENT TO AVOID ROUTING CONGESTION

(75) Inventors: Chaitra M. Bhat, Bangalore (IN); M. Chandrika, Bangalore (IN); Atsushi Sugai, Kyoto (JP); Toshihiko Yokota, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 408 days.

(21) Appl. No.: 11/153,707

(22) Filed: Jun. 14, 2005

(65) Prior Publication Data

US 2006/0282809 A1 Dec. 14, 2006

(51) Int. Cl.
*G06F 17/50* (2006.01)

(52) U.S. Cl. ........................ 716/9; 716/1; 716/2; 716/7

(58) Field of Classification Search .................... 716/1, 716/2, 7, 9
See application file for complete search history.

(56) References Cited

U.S. PATENT DOCUMENTS 6,058,254 A 5/2000 Scepanovic et al.
6,068,662 A 5/2000 Scepanovic et al.
6,123,736 A 9/2000 Pavisic et al.
6,192,508 B1 2/2001 Malik et al.
2002/0053062 A1* 5/2002 Szymanski .................. 714/801
2004/0040007 A1 2/2004 Harn

FOREIGN PATENT DOCUMENTS

JP 08247399 4/1998

* cited by examiner

*Primary Examiner*—Thuan Do
(74) *Attorney, Agent, or Firm*—Schmeiser, Olsen & Watts; William H. Steinberg

(57) ABSTRACT

A novel logic design method for avoiding wiring congestion. According to the novel logic design method, an original gate having multiple inputs coming from different directions and having multiple outputs coming to different directions can be transformed to a logic block that has an input stage and an output stage. The gates of the input stage receive signals from the multiple inputs of the original gate. The gates of the output stage send signals to the multiple outputs of the original gate. Each gate of the input stage is placed in a vicinity of its inputs. Each gate of the output stage is placed in a vicinity of its outputs. The gates of the input and output stages are functionally equivalent to the original gate.

13 Claims, 8 Drawing Sheets

299

START

PLACING T GATES IN THE INPUT STAGE. —280

DIVIDING OUTPUTS OF OUTPUT GATE E INTO P OUTPUT GROUPS. —282

PLACING P GATES IN THE OUTPUT STAGE. —284

PLACING EACH GATE OF THE INPUT STAGE IN A VICINITY OF THE GATE'S INPUTS. —286

- REPLACING EACH GATE OF THE INPUT STAGE BY OTHER GATES.
- PLACING EACH GATE OF THE INPUT STAGE IN A VICINITY OF ITS INPUTS.
- MAKING CONNECTION BETWEEN THE GATES OF THE INPUT STAGE.

—288

DETERMINING THE FUNCTIONS OF THE GATES IN THE INPUT STAGE. —290

PLACING EACH GATE OF THE OUTPUT STAGE IN A VICINITY OF THE GATE'S OUTPUTS. —292

STOP

LOGIC TRANSFORMATION AND GATE PLACEMENT TO AVOID ROUTING CONGESTION

BACKGROUND OF THE INVENTION

1. Technical Field

The present invention relates to logic design, and more particularly, to a logic design method to avoid routing congestion.

2. Related Art

In a conventional digital circuit, a logic block can receive signals from multiple inputs from different directions and send signals to multiple outputs at different directions. Typically, the logic block tends to be placed at a central area of the digital circuit surrounded by the inputs and outputs of the logic block. This tends to result in wiring congestion in the central area.

It is always desirable to reduce wiring congestion in logic design. Minimizing wiring congestion improves wirability and reduces the adjacency capacitance impact on timing and noise. As a result, there is a need for a logic design method for reducing wiring congestion in a logic design.

SUMMARY OF THE INVENTION

The present invention provides a logic design method, comprising the steps of (a) providing a logic block comprising an input stage and an output stage; and (b) placing each input gate of the input stage in a vicinity of the input gate's respective inputs.

The present invention also provides a logic design method, comprising the steps of (a) transforming a gate G into a logic block including an input stage and an output stage, wherein inputs of the input stage are the inputs of the gate G, and wherein outputs of the output stage are the outputs of the gate G; and (b) placing each input gate of the input stage in a vicinity of the input gate's respective inputs.

The present invention also provides a logic design method, comprising the steps of (a) transforming a two-stage logic into the logic block including an input stage and an output stage, wherein the two-stage logic includes a first stage and a second stage, wherein the first stage includes T gates, and wherein the second stage includes an output gate that is configured to receive input signals from all the T gates of the first stage; and (b) placing each input gate of the input stage in a vicinity of the input gate's respective inputs.

The present invention provides a logic design method for reducing wiring congestion in a logic design.

DETAILED DESCRIPTION OF THE INVENTION

Figure 1A:
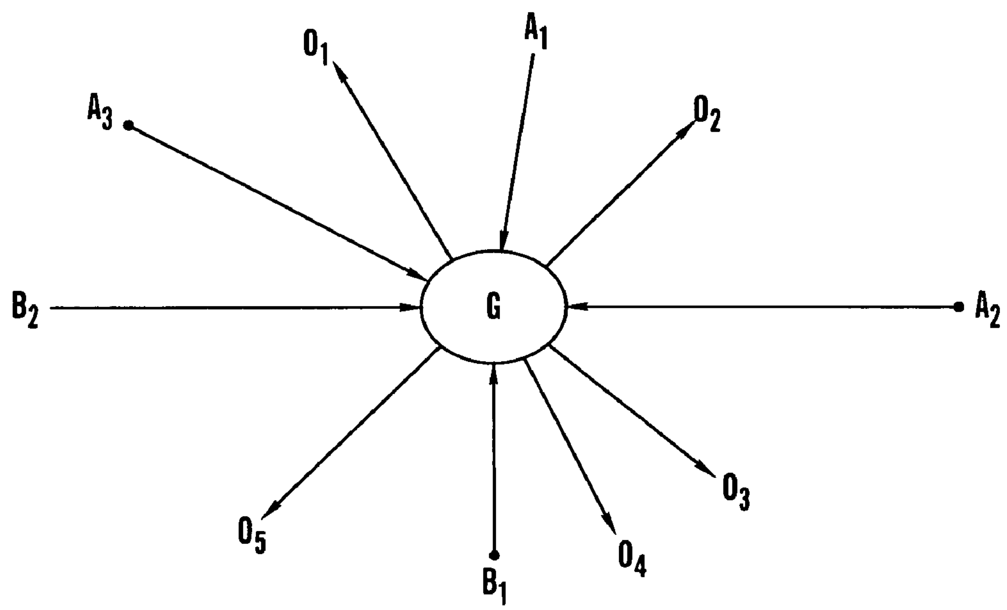
FIGS. 1A-1C show logic diagrams used to illustrate a first logic design method, in accordance with embodiments of the present invention.
Figure 1B:
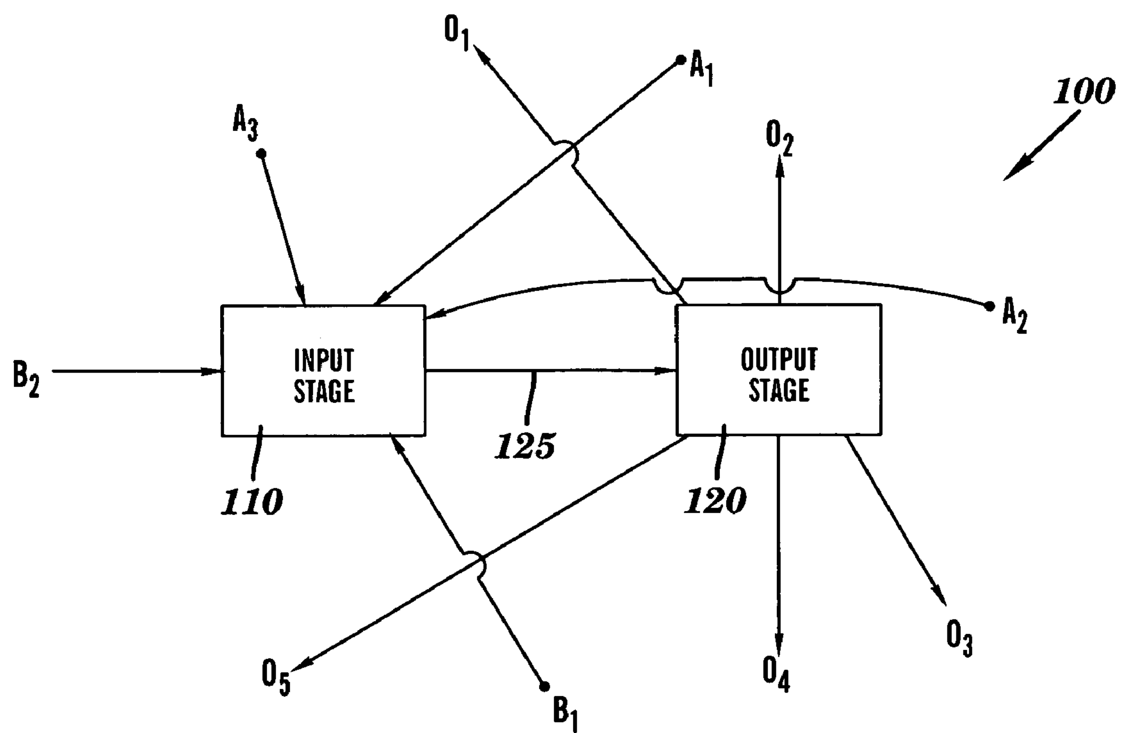
Figure 1C:
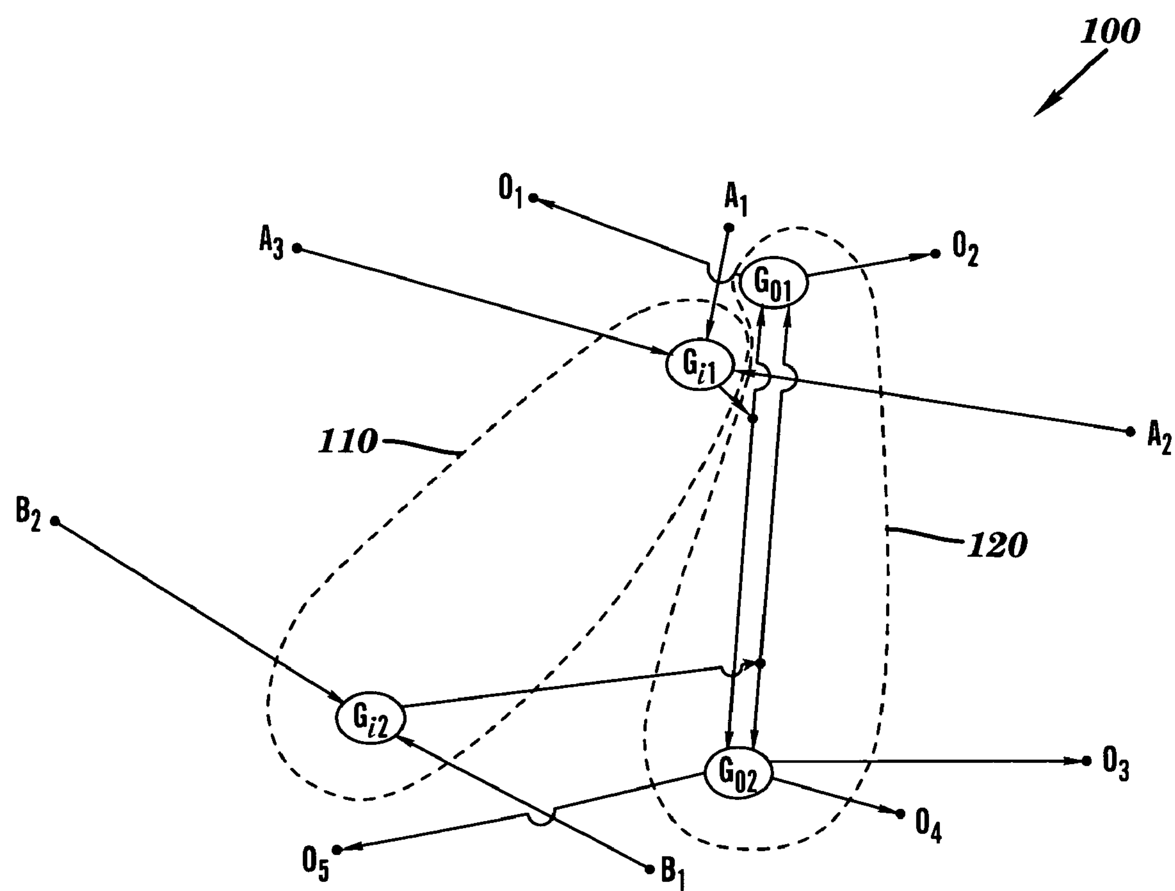
Figure 1D:
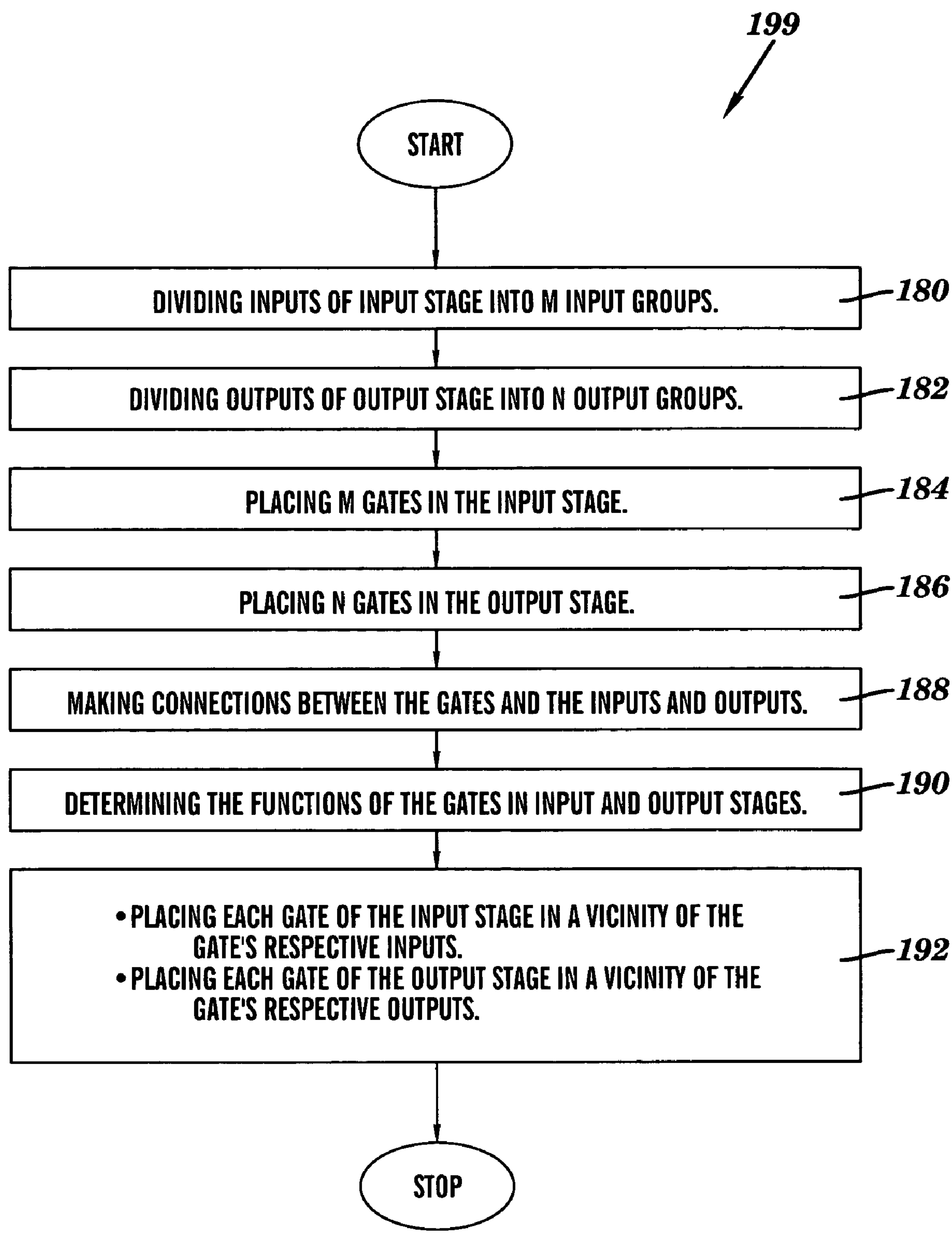
FIG. 1D is a flowchart that illustrates the first logic design method.

FIGS. 1A-1C show logic diagrams used to illustrate a first logic design method, in accordance with embodiments of the present invention. FIG. 1D is a flowchart 199 that illustrates the first logic design method. More specifically, with reference to FIG. 1A, as a first example to illustrate the first logic design method, assume that a gate G receives input signals from inputs A1, A2, A3, B1, and B2, and sends output signals to outputs O1, O2, O3, O4, and O5. The input signals from the inputs A1, A2, A3, B1, and B2 come to the gate G from different directions: North, East, North-West, South, and West, respectively. The output signals from gate G fans-out to outputs O1, O2, O3, O4, and O5 in different directions: North-West, North-East, South-East, South-East, and South-West, respectively.

With reference to FIG. 1B, in one embodiment, the first logic design method starts with the step of transforming the gate G (FIG. 1A) into a logic block 100 which comprises an input stage 110 and an output stage 120. In one embodiment, the inputs of the input stage 110 can be also the inputs of the gate G of FIG. 1A (i.e., the inputs A1, A2, A3, B1, and B2), and the outputs of the output stage 120 can be also the outputs of the gate G of FIG. 1A (i.e., the outputs O1, O2, O3, O4, and O5). In addition, the input stage 110 is configured to send signals to the output stage 120 via connections 125.

In one embodiment, the step of transforming the gate G (FIG. 1A) into the logic block 100 can comprise the following sub-steps (steps 180-190 of FIG. 1D).

In a first sub-step (step 180 of FIG. 1D), in one embodiment, all the inputs of the input stage 110 can be divided into M input groups of at least two proximate inputs (M is a positive integer). "Proximate" can be defined in different ways. For instance, in one definition, two or more points on a plane can be considered proximate to each other if the radius of the smallest circle within which the points reside is less than a pre-specified value. In the first example above, assume that inputs A1, A2, and A3 are proximate to each other, and that inputs B1 and B2 are proximate to each other. As a result, the five inputs A1, A2, A3, B1, and B2 can be divided into M=2 input groups of at least 2 proximate inputs: (A1, A2, A3) and (B1, B2).

In a next sub-step (step 182 of FIG. 1D), in one embodiment, all the outputs of the output stage 120 can be divided into N output groups of at least two proximate outputs (N is a positive integer). In the first example above, assume that outputs O1 and O2 are proximate to each other, and that outputs O3, O4, and O5 are proximate to each other. As a result, the five outputs O1, O2, O3, O4, and O5 can be divided into N=2 output groups of at least two proximate outputs: (O1, O2) and (O3, O4, O5).

In a next sub-step (step 184 of FIG. 1D), in one embodiment, as a result of the inputs division above, the input stage 110 can comprise M gates (not shown) corresponding to the M input groups. Similarly, the output stage 120 can comprise N gates (not shown) corresponding to the N output groups (step 186 of FIG. 1D).

In the first example above, with reference to FIGS. 1B and 1C, because there are M=2 input groups (A1, A2, A3) and (B1, B2), the input stage 110 can comprise M=2 gates Gi1 and Gi2 (FIG. 1C) corresponding to the M=2 input groups (A1, A2, A3) and (B1, B2), respectively. Similarly, because there are N=2 output groups (O1, O2) and (O3, O4, O5), the output stage 120 can comprise N=2 gates Go1 and Go2

(FIG. 1C) corresponding to the N=2 output groups (O1, O2) and (O3, O4, O5), respectively.

In a next sub-step (step 188 of FIG. 1D), in one embodiment, connections between the M gates and the N gates and the inputs and outputs can be made as follows. Each gate of the M gates of the input stage 110 is configured to receive input signals from all the inputs of the gate's corresponding input group. In the first example above, gate Gi1 is configured to receive input signals from the inputs A1, A2, A3. Similarly, gate Gi2 is configured to receive input signals from the inputs B1, B2.

In one embodiment, each gate of the N gates of the output stage 120 is configured to receive input signals from all the M gates of the input stage 110. In the first example above, gate Go1 is configured to receive input signals from all the M=2 gates Gi1 and Gi2 of the input stage 110. Similarly, gate Go2 is configured to receive input signals from all the M=2 gates Gi1 and Gi2 of the input stage 110.

Also, in one embodiment, each gate of the N gates of the output stage 120 is configured to send output signals to all the outputs of its corresponding output group. In the first example above, gate Go1 is configured to send output signals to the outputs O1 and O2. Similarly, gate Go2 is configured to send output signals to the outputs O3, O4, O4.

In a next sub-step (step 190 of FIG. 1D), in one embodiment, the M gates and N gates in the input stage 110 and output stage 120, respectively are such chosen such that they are functionally equivalent to the gate G (FIG. 1A).

In the first example above, if the gate G (FIG. 1A) is an OR gate, then the gates Gi1 and Gi2 and the gates Go1 and Go2 can all be OR gates. If the gate G (FIG. 1A) is an AND gate, then the gates Gi1 and Gi2 and the gates Go1 and Go2 can all be AND gates. Alternatively, if the gate G (FIG. 1A) is an OR gate, then the gates Gi1 and Gi2 of the input stage 110 can be NOR gates, and the gates Go1 and Go2 of the output stage 120 can be NAND gates. If the gate G (FIG. 1A) is an AND gate, then the gates Gi1 and Gi2 of the input stage 110 can be NAND gates, and the gates Go1 and Go2 of the output stage 120 can be NOR gates.

Next, after the step of transforming the gate G (FIG. 1A) into the logic block 100 (i.e., steps 180-190 of FIG. 1D), the first logic design method continues with the step of placing each gate of the input stage 110 in a vicinity of the gate's respective inputs and placing each gate of the output stage 120 in a vicinity of the gate's respective outputs (step 192 of FIG. 1D). "In a vicinity" can be defined in different ways. For instance, a point X can be considered being in a vicinity of points $X_i$, i=1, . . . , L (L is a positive integer) if $\Sigma D_i^2$, (i=1, . . . , L) does not exceed a pre-specified value, wherein $D_i$ is the distance between X and $X_i$.

In the first example above, with reference to FIG. 1C, gate Gi1 of the input stage 110 can be placed in a vicinity of its respective inputs A1, A2, and A3. Similarly, the gate Gi2 of the input stage 110 can be placed in a vicinity of its respective inputs B1 and B2. Similarly, the gate Go1 of the output stage 120 can be placed in a vicinity of its respective outputs O1 and O2. The gate Go2 of the output stage 120 can be placed in a vicinity of its respective outputs O3, O4, and O5.

As can be seen in FIG. 1C, the central area surrounded by the inputs A1, A2, A3, B1, and B2 and the outputs O1, O2, O3, O4, and O5 is less crowded because the replacing gates Gi1, Gi2, Go1, and Go2 are placed close to their inputs or outputs.

Figure 2A:
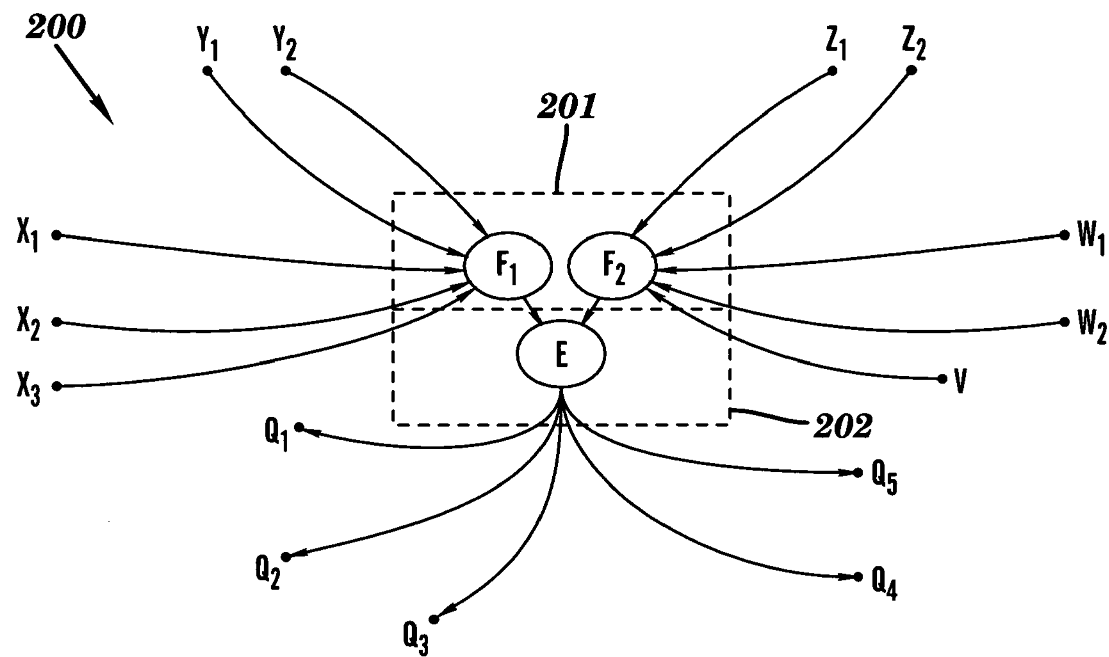
FIGS. 2A-2C show logic diagrams used to illustrate a second logic design method, in accordance with embodiments of the present invention.
Figure 2B:
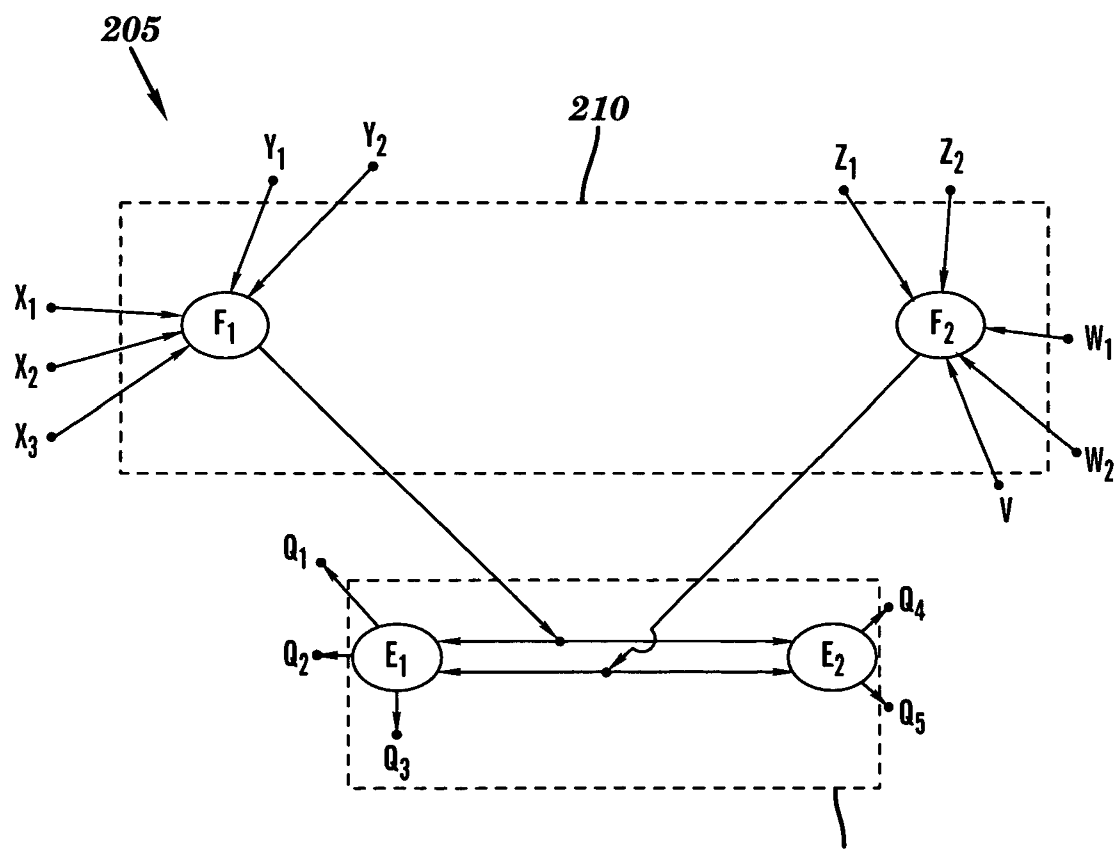
Figure 2C:
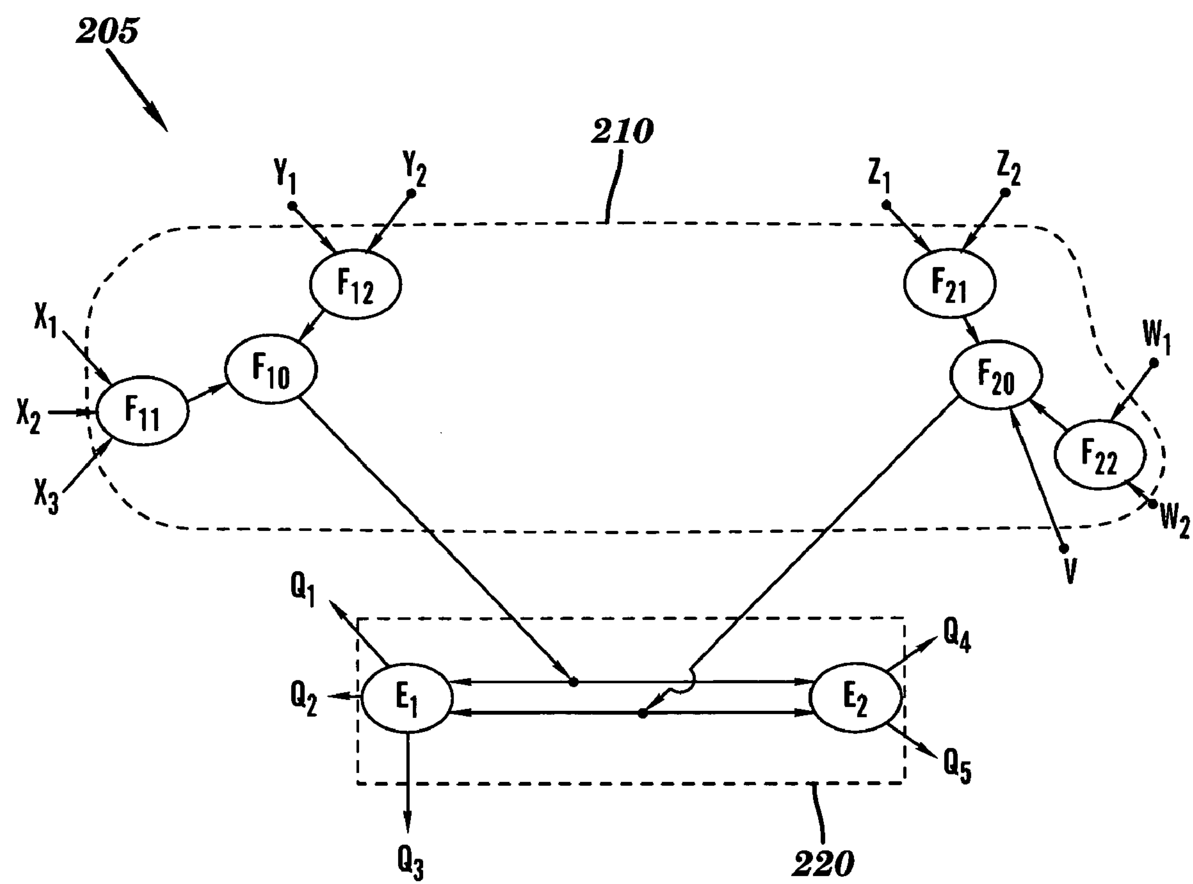
Figure 2D:
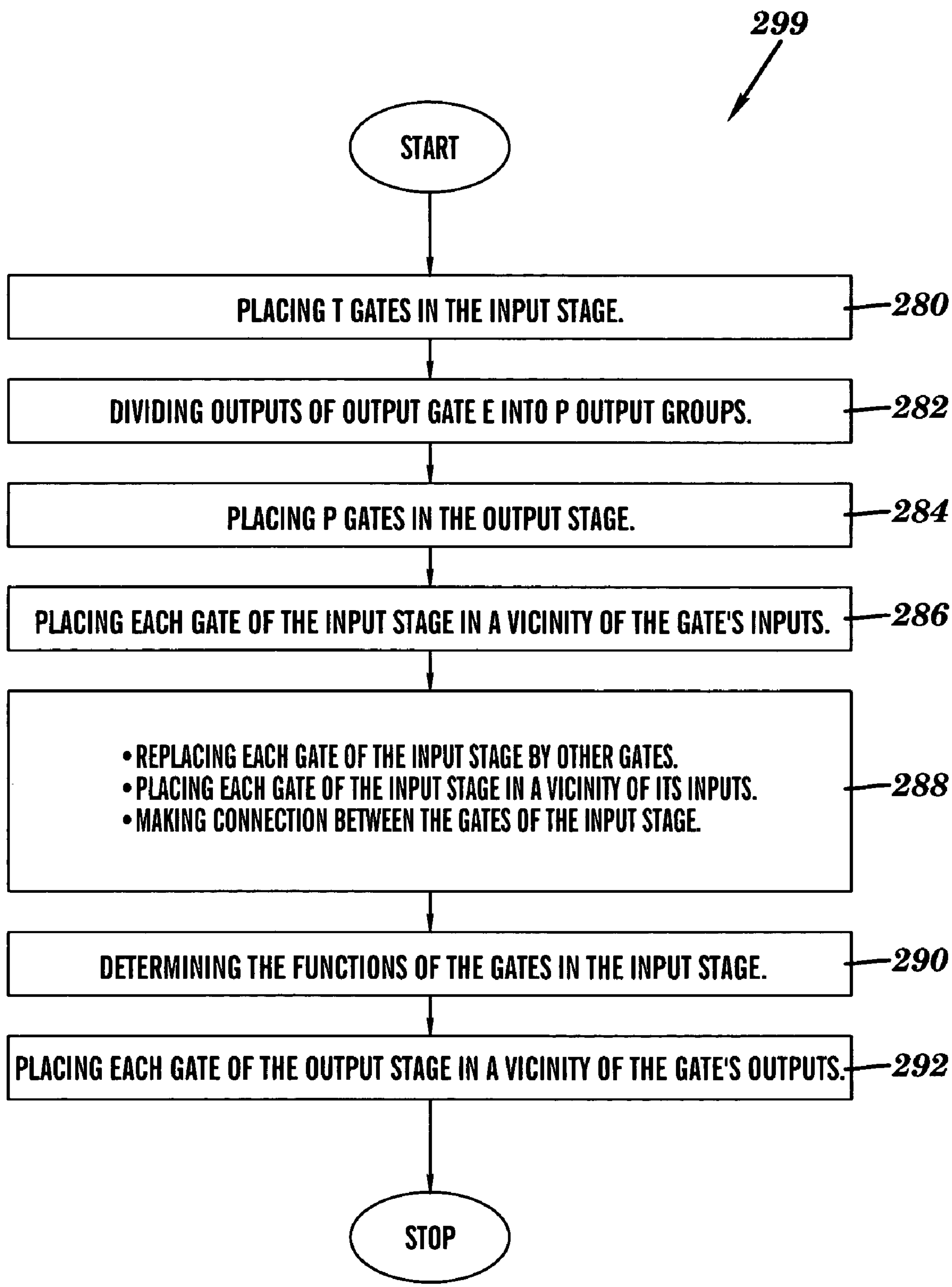
FIG. 2D is a flowchart that illustrates the second logic design method.

FIGS. 2A-2C show logic diagrams used to illustrate a second logic design method, in accordance with embodiments of the present invention. FIG. 2D is a flowchart 299 that illustrates the second logic design method. More specifically, with reference to FIG. 2A, as a second example to illustrate the second logic design method, assume that a two-stage logic 200 comprises a first stage 201 and a second stage 202. Assume further that the first stage 201 comprises 2 gates F1 and F2 (in general, the first stage 201 can comprise T gates, wherein T is a positive integer), and that the second stage 202 comprises an output gate E that is configured to receive input signals from all the 2 gates of the first stage 201.

In the second example above, assume further that the gate F1 has five inputs X1, X2, X3, Y1, and Y2, of which inputs X1, X2, and X3 are proximate to each other, and inputs Y1 and Y2 are proximate to each other. Assume further that the gate F2 has five inputs Z1, Z2, W3, W1, and V, of which inputs Z1 and Z2 are proximate to each other, and inputs W1 and W2 are proximate to each other. Assume further that the output gate E has five outputs Q1, Q2, Q3, Q4, and Q5 of which outputs Q1, Q2, and Q3 are proximate to each other, and outputs Q4 and Q5 are proximate to each other.

With reference to FIG. 2B, in one embodiment, the second logic design method starts with the step of transforming the two-stage logic 200 (FIG. 2A) into a logic block 205 which comprises an input stage 210 and an output stage 220. In one embodiment, the step of transforming the two-stage logic 200 (FIG. 2A) into the logic block 205 can comprise the following sub-steps (steps 280-284 of FIG. 2D).

In a first sub-step (step 280 of FIG. 2D), in one embodiment, all the T gates of the first stage 201 (FIG. 2A), i.e., gates F1 and F2 in the second example above, are placed in the input stage 210 of the logic block 205. In other words, the input stage 210 of the logic block 205 can comprise the same gates as the first stage 201 (FIG. 2A).

In a next sub-step (step 282 of FIG. 2D), in one embodiment, the outputs of the output gate E (FIG. 2A) can be divided into P output groups of at least two proximate outputs, wherein P is a positive integer. In the second example above, the outputs Q1, Q2, Q3, Q4, and Q5 can be divided into P=2 output groups: (Q1, Q2, Q3) and (Q4, Q5) because Q1, Q2, and Q3 are proximate to each other, and because Q4 and Q5 are proximate to each other.

In a next sub-step (step 284 of FIG. 2D), in one embodiment, as a result of the outputs division above, P gates (not shown) corresponding to the P output groups can be placed in the output stage 220. In one embodiment, each gate of the P gates is (i) functionally equivalent to the output gate E (FIG. 2A), (ii) is configured to receive input signals from all the gates of the input stage 210 (i.e., gates F1 and F2), and (iii) is configured to send output signals to all the outputs of the gate's corresponding output group.

In the second example above, P=2 gates E1 and E2 can be placed in the output stage 220, wherein each of the gates E1 and E2 is (i) functionally equivalent to the output gate E, (ii) is configured to receive input signals from both the gates F1 and F2, and (iii) is configured to send output signals to all the outputs of the gate's corresponding output group. More specifically, gate E1 is configured to send output signals to its outputs Q1, Q2, and Q3. Similarly, gate E2 is configured to send output signals to its outputs Q4 and Q5.

Next, in one embodiment, the second logic design method further comprises the step of (step 286 of FIG. 2D), placing each gate of the input stage 210 in a vicinity of the gate's inputs. In the second example above, gate F1 is placed in a vicinity of its inputs X1, X2, X3, Y1, and Y2. Similarly, gate F2 is placed in a vicinity of its inputs Z1, Z2, W1, W2, and V.

Next, with reference to FIG. 2C, in one embodiment, the second logic design method further comprises the step of (step 288 of FIG. 2D), for each gate Fi, i=1, . . . , T of the T gates of the input stage 210, (a) dividing inputs of the gate Fi into Qi input groups of at least two proximate inputs and Ri individual inputs, wherein Qi and Ri are non-negative integers but are not both equal to zero; (b) replacing the gate Fi by Qi+1 gates, wherein one gate Fi0 of the Qi+1 gates is located where the gate Fi was, and wherein the other Qi gates of the Qi+1 gates correspond to the Qi input groups; and (c) placing each gate of the other Qi gates in a vicinity of the gate's corresponding input group, wherein each gate of the other Qi gates is configured to receive input signals from all the inputs of the gate's corresponding input group, wherein the gate Fi0 is configured to receive input signals from all the other Qi gates and from all the Ri individual inputs, and wherein each gate of the P gates of the output stage is configured to receive input signals from all the gates Fi0, i=1, . . . , T.

In the second example above, T=2. For gate F1 (FIG. 2B), its inputs X1, X2, X3, Y1, and Y2 can be divided into Q1=2 input groups: (X1, X2, X3) and (Y1, Y2). It should be noted that R1=0. As a result, gate F1 (FIG. 2B) can be replaced by Q1+1=3 gates F10, F11, and F12 (FIG. 2C), wherein F10 is located where the gate F1 was. The gates F11 and F12 correspond to and are placed in a vicinity of the input groups (X1, X2, X3) and (Y1, Y2), respectively. The gate F10 receives signals from gates F11 and F12.

Similarly, for gate F2 (FIG. 2B), its inputs Z1, Z2, W1, W2, and V can be divided into Q2=2 input groups: (Z1, Z2) and (W1, W2) and R2=1 individual input V. As a result, gate F2 (FIG. 2B) can be replaced by Q2+1=3 gates F20, F21, and F22, wherein F20 is located where the gate F2 was. The gates F21 and F22 correspond to and are placed in a vicinity of the input groups (Z1, Z2) and (W1, W2), respectively. The gate F20 receives signals from gates F21 and F22 and also from the individual input V.

Next, in one embodiment, the functions of the gates in the input stage 220 are determined (step 290 of FIG. 2D). In one embodiment, the replacing gates can be functionally equivalent to the gate they replace. More specifically, for i=1, . . . , T, if the gate Fi is an OR gate, then all the Qi gates and the gate Fi0 can be OR gates; and if the gate Fi is an AND gate, then all the Qi gates and the gate Fi0 can be AND gates.

In the second example above, if gate F1 is an OR gate, then gates F10, F11, and F12 can be OR gates. If gate F1 is an AND gate, then gates F10, F11, and F12 can be AND gates. Similarly, if gate F2 is an OR gate, then gates F20, F21, and F22 can be OR gates. If gate F2 is an AND gate, then gates F20, F21, and F22 can be AND gates.

Alternatively, in one embodiment, for i=1, . . . , T, if the gate Fi is an OR gate, then all the Qi gates can be NOR gates, and the gate Fi0 can be a NAND gate; and if the gate Fi is an AND gate, then all the Qi gates can be NAND gates, and the gate Fi0 can be a NOR gate.

In the example above, if gate F1 is an OR gate, then F11 and F12 can be NOR gates, and the gate F10 can be a NAND gate; and if the gate F1 is an AND gate, then gates F11 and F12 can be NAND gates, and the gate F10 can be a NOR gate. Similarly, if gate F2 is an OR gate, then F21 and F22 can be NOR gates, and the gate F20 can be a NAND gate; and if the gate F2 is an AND gate, then gates F21 and F22 can be NAND gates, and the gate F20 can be a NOR gate.

Next, in one embodiment, the second logic design method further comprises the step of placing each gate of the output stage 220 in a vicinity of the gate's corresponding outputs (step 292 of FIG. 2D). In the second example above, gate E1 is placed in a vicinity of outputs Q1, Q2, and Q3. Similarly, gate E2 is placed in a vicinity of outputs Q4 and Q5.

As can be seen in FIG. 2C, the central area surrounded by the inputs X1, X2, X3, Y1, Y2, Z1, Z2, W1, W2, and V and the outputs Q1, Q2, Q3, Q4, and Q5 is less crowded because the replacing gates are placed close to their inputs or outputs.

In the embodiments described above, the transformed logic block can comprise one gate (e.g., gate G of FIG. 1A) or two levels of gates (the two-stage logic 200 of FIG. 2A). In general, if an original logic block has more than two levels of gates, the original logic block can be first reduced to two levels of gates using any conventional transformation methods. Then, the second logic design method of the present invention can be applied.

Figure 3:
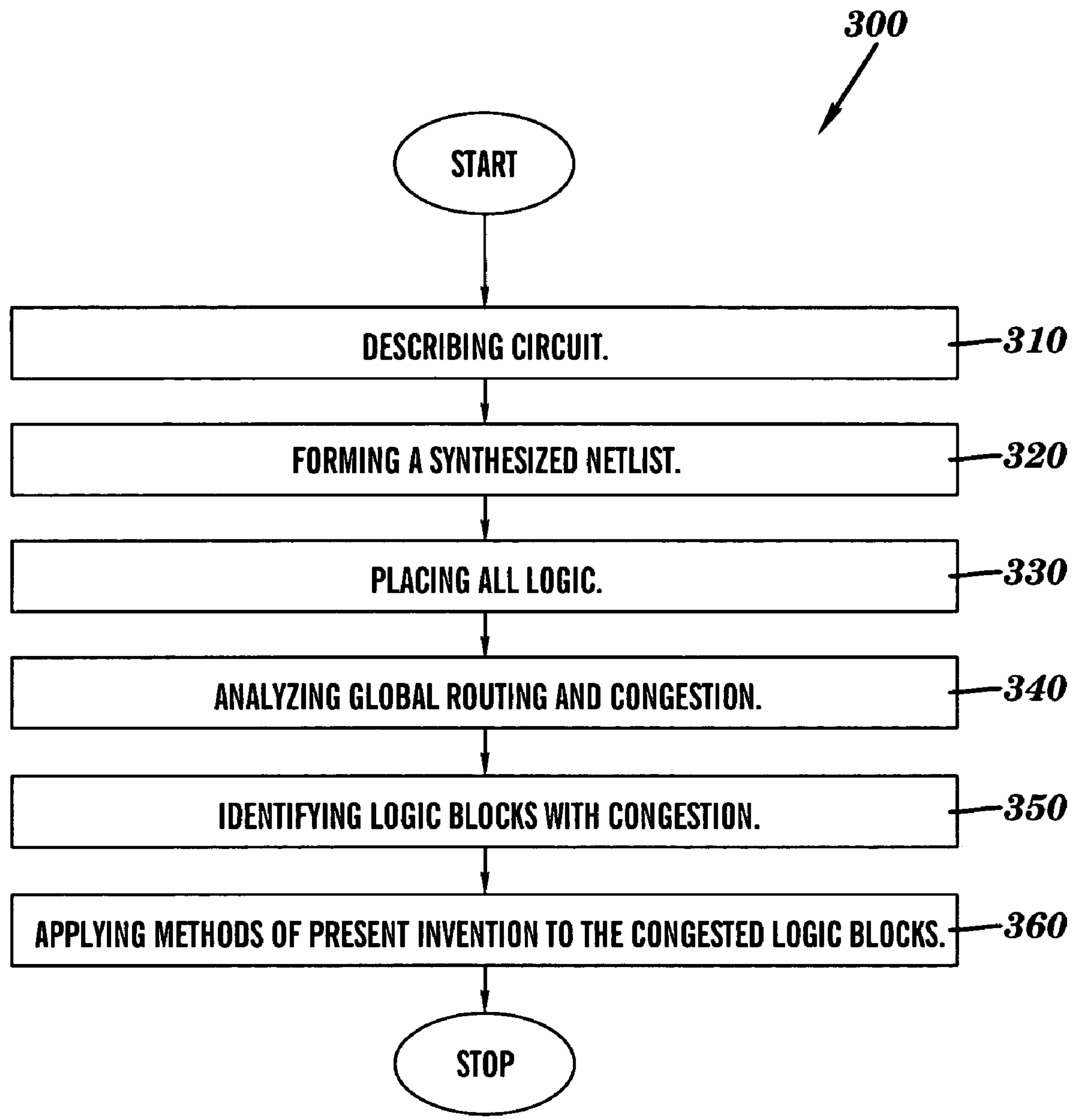
FIG. 3 illustrates a flow chart of a logic design method, in accordance with embodiments of the present invention.

FIG. 3 illustrates a flow chart of a logic design method 300 that utilizes the present invention. The logic design method 300 starts with a step 310 in which a circuit is described at a high level (i.e., circuit component diagram). Next, in step 320, the high level circuit description is synthesized (i.e., converted) into a list of logic gates and their interconnections called a netlist. Next, in step 330, the locations of the logic gates are determined. Next, in step 340, the routing scheme and congestion are analyzed. Next, in step 350, based on the analysis in step 340, logic blocks with congestion can be identified. Then, in step 360, the methods of the present invention described in the embodiments above can be applied to the congested logic blocks.

The methods of the present invention can be applied to selective logical blocks during physical design. This does not require synthesis placement iteration.

Figure 4:
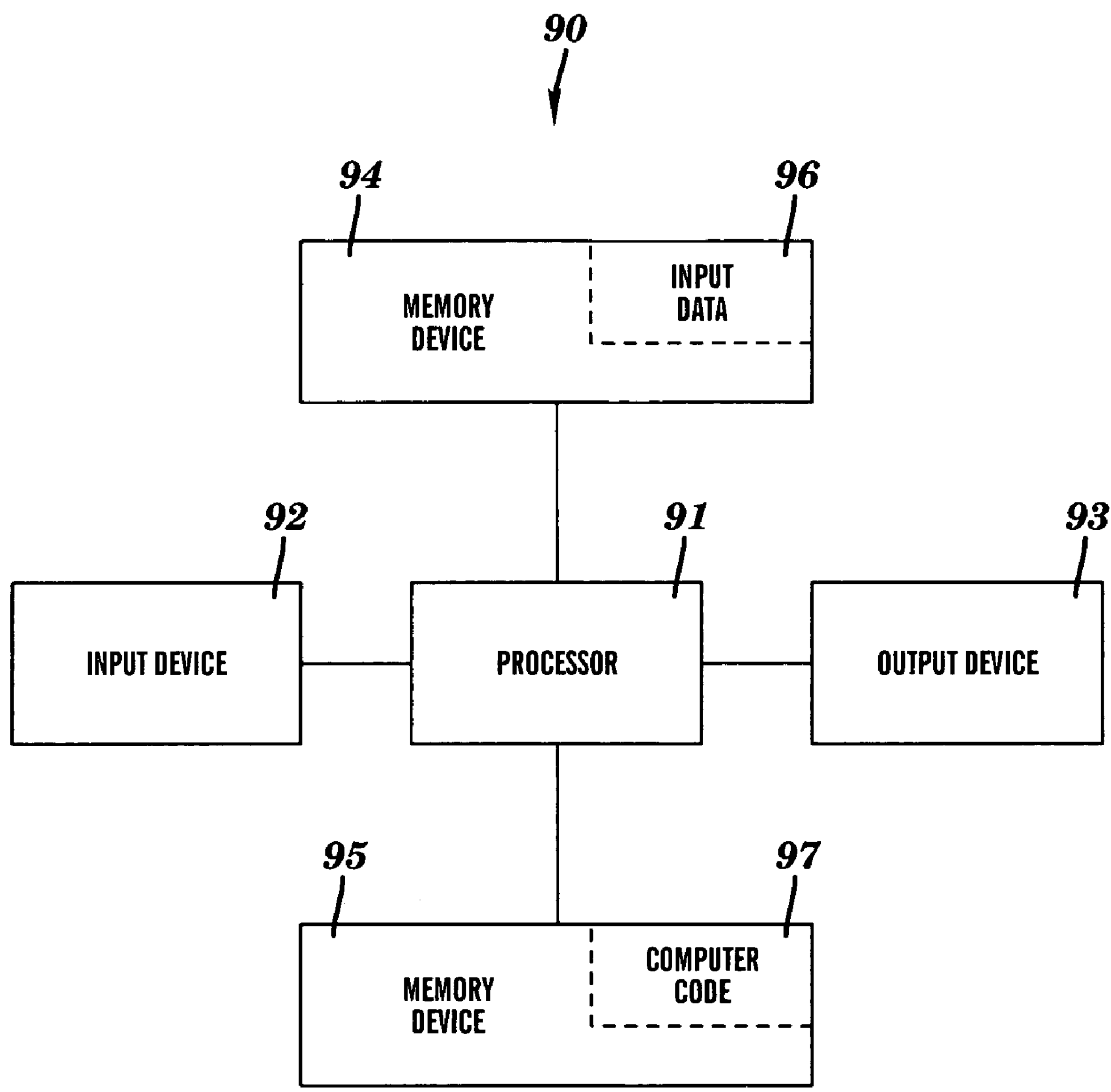
FIG. 4 illustrates a computer system 90 used for simulating the methods of the present invention.

FIG. 4 illustrates a computer system 90 used for simulating the methods of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for simulating the methods of the present invention (FIGS. 1D, 2D, and 3). The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 4) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

Thus the present invention discloses a process for deploying computing infrastructure, comprising integrating computer-readable code into the computer system 90, wherein the code in combination with the computer system 90 is capable of performing a method for simulating the methods of the present invention.

While FIG. 4 shows the computer system 90 as a particular configuration of hardware and software, any configuration of hardware and software, as would be known to a person of ordinary skill in the art, may be utilized for the purposes stated supra in conjunction with the particular computer system 90 of FIG. 4. For example, the memory devices 94 and 95 may be portions of a single memory device rather than separate memory devices.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A logic design method, comprising the steps of:

(a) providing a logic block comprising an input stage and an output stage; and (b) placing each input gate of the input stage in a vicinity of the input gate's respective inputs, wherein step (a) comprises the step of transforming a gate G into the logic block, wherein inputs of the input stage are the inputs of the gate G, and wherein outputs of the output stage are the outputs of the gate G wherein the step of transforming the gate G into the logic block comprises the steps of:

dividing the inputs of the gate G into M input groups, each group of the M input groups having at least two proximate inputs;

dividing the outputs of the gate G into N output groups, each group of the N output groups having at least two proximate outputs; and replacing the gate G by (i) M gates in the input stage corresponding to the M input groups and (ii) N gates in the output stage corresponding to the N output groups, wherein M and N are positive integers, wherein each gate of the M gates is configured to receive input signals from all the inputs of its corresponding input group, wherein each gate of the N gates is configured to receive input signals from all the M gates, and wherein each gate of the N gates is configured to send output signals to all outputs of its corresponding output group.

2. The method of claim 1, wherein if the gate G is an OR gate, then all the M gates and the N gates are OR gates, and if the gate G is an AND gate, then all the M gates and the N gates are AND gates.

3. The method of claim 1, wherein if the gate G is an OR gate, then all the M gates are NOR gates, and the N gates are NAND gates, and if the gate G is an AND gate, then all the M gates are NAND gates, and the N gates are NOR gates.

4. A logic design method, comprising the steps of:

(a) providing a logic block comprising an input stage and an output stage; and (b) placing each input gate of the input stage in a vicinity of the input gate's respective inputs, wherein step (a) comprises the step of transforming a two-stage logic into the logic block, wherein the two-stage logic includes a first stage and a second stage, wherein the first stage includes T gates, and wherein the second stage includes an output gate that is configured to receive input signals from all the T gates of the first stage.

5. The method of claim 4, wherein the step of transforming the two-stage logic into the logic block comprises the steps of:

placing the T gates in the input stage of the logic block;

dividing outputs of the output gate into P output groups, each group of the P output groups having at least two proximate outputs, wherein P is a positive integer; and placing in the output stage of the logic block P gates corresponding to the P output groups, wherein each gate of the P gates is (i) functionally equivalent to the output gate, (ii) is configured to receive input signals from all the T gates of the input stage, and (iii) is configured to send output signals to all the outputs of its corresponding output group.

6. The method of claim 5, further comprising the steps of, after step (b) is performed, for each gate Fi, i=1, . . . , T of the T gates of the input stage:

dividing inputs of the gate Fi into Qi input groups, each group of the Qi input groups having at least two proximate inputs and Ri individual inputs, wherein Qi and Ri are non-negative integers but are not both equal to zero;

replacing the gate Fi by Qi+1 gates, wherein one gate Fi0 of the Qi+1 gates is located where the gate Fi was, and wherein the other Qi gates of the Qi+1 gates correspond to the Qi input groups; and placing each gate of the Qi gates in a vicinity of its corresponding input group, wherein each gate of the Qi gates is configured to receive input signals from all the inputs of its corresponding input group, wherein the gate Fi0 is configured to receive input signals from all the Qi gates and from all the Ri individual inputs, and wherein each gate of the P gates of the output stage is configured to receive input signals from all the gates Fi0, i=1, . . . , T.

7. A logic design method, comprising the steps of:

(a) transforming a gate G into a logic block including an input stage and an output stage, wherein inputs of the input stage are the inputs of the gate G, and wherein outputs of the output stage are the outputs of the gate G; and (b) placing each input gate of the input stage in a vicinity of the input gate's respective inputs, wherein the step of transforming the gate G into the logic block comprises the steps of:

dividing inputs of the gate G into M input groups, at least two proximate inputs;

dividing outputs of the gate G into N output groups, each group of the N output groups having at least two proximate outputs; and replacing the gate G by (i) M gates in the input stage corresponding to the M input groups and (ii) N gates in the output stage corresponding to the N output groups, wherein M and N are positive integers, wherein each gate of the M gates is configured to receive input signals from all the inputs of its corresponding input group, wherein each gate of the N gates is configured to receive input signals from all the M gates, and wherein each gate of the N gates is configured to send output signals to all outputs of its corresponding output group.

8. The method of claim 7, wherein if the gate G is an OR gate, then all the M gates and the N gates are OR gates, and if the gate G is an AND gate, then all the M gates and the N gates are AND gates.

9. The method of claim 7, wherein if the gate G is an OR gate, then all the M gates are NOR gates, and the N gates are NAND gates, and if the gate G is an AND gate, then all the M gates are NAND gates, and the N gates are NOR gates.

10. A logic design method, comprising the steps of:

(a) transforming a two-stage logic into the logic block including an input stage and an output stage, wherein the two-stage logic includes a first stage and a second stage, wherein the first stage includes T gates, and wherein the second stage includes an output gate that is configured to receive input signals from all the T gates of the first stage; and (b) placing each input gate of the input stage in a vicinity of the input gate's respective inputs, wherein the step of transforming two-stage logic into the logic block comprises the steps of:

placing the T gates in the input stage of the logic block;

dividing outputs of the output gate into P output groups, each group of the P output groups having at least two proximate outputs, wherein P is a positive integer; and placing in the output stage of the logic block P gates corresponding to the P output groups, wherein each gate of the P gates is (i) functionally equivalent to the output gate, (ii) is configured to receive input signals from all the T gates of the input stage, and (iii) is configured to send output signals to all the outputs of its corresponding output group.

11. The method of claim 10, further comprising the steps of, after step (b) is performed, for each gate Fi, i=1, . . . , T of the T gates of the input stage:

dividing inputs of the gate Fi into Qi input groups, each group of the Qi input groups having at least two proximate inputs and Ri individual inputs, wherein Qi and Ri are non-negative integers but are not both equal to zero;

replacing the gate Fi by Qi+1 gates, wherein one gate Fi0 of the Qi+1 gates is located where the gate Fi was, and wherein the other Qi gates of the Qi+1 gates correspond to the Qi input groups; and placing each gate of the Qi gates in a vicinity of its corresponding input group, wherein each gate of the Qi gates is configured to receive input signals from all the inputs of its corresponding input group, wherein the gate Fi0 is configured to receive input signals from all the Qi gates and from all the Ri individual inputs, and wherein each gate of the P gates of the output stage is configured to receive input signals from all the gates Fi0, i=1, . . . , T.

12. The method of claim 11, wherein for i=1, . . . , T, if the gate Fi is an OR gate, then all the Qi gates and the gate Fi0 are OR gates, and if the gate Fi is an AND gate, then all the Qi gates and the gate Fi0 are AND gates.

13. The method of claim 11, wherein for i=1, . . . , T, if the gate Fi is an OR gate, then all the Qi gates are NOR gates, and the gate Fi0 is a NAND gate, and if the gate Fi is an AND gate, then all the Qi gates are NAND gates, and the gate Fi0 is a NOR gate.

* * * * *